US006365956B1

(12) United States Patent
Nonaka

(10) Patent No.: US 6,365,956 B1
(45) Date of Patent: Apr. 2, 2002

(54) RESISTOR ELEMENT COMPRISING PERIPHERAL CONTACTS

(75) Inventor: Makoto Nonaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/490,703

(22) Filed: Jan. 24, 2000

(30) Foreign Application Priority Data

Jan. 25, 1999 (JP) .......................................... 11-016018

(51) Int. Cl.[7] ......................... H01L 29/00; H01L 29/74; H01L 31/111

(52) U.S. Cl. ....................... 257/537; 257/533; 257/536; 257/538; 257/154

(58) Field of Search ................................ 257/154, 359, 257/536–538, 533, 581

(56) References Cited

U.S. PATENT DOCUMENTS 4,001,865 A * 1/1977 Voss ............................ 357/38
4,008,484 A * 2/1977 Maekawa et al. ............. 357/36
5,446,311 A * 8/1995 Ewen et al. ................ 257/531
5,541,442 A * 7/1996 Keil et al. .................. 257/533
6,023,092 A * 2/2000 Tung .......................... 257/547

* cited by examiner

*Primary Examiner*—Eddie Lee
*Assistant Examiner*—Jesse A. Fenty

(57) ABSTRACT

A resistor element according to the present invention comprises a resistive layer provided on a semiconductor substrate through a first insulating film, a first wiring layer provided on the resistive layer through a second insulating film, a second wiring layer provided on the first wiring layer through a third insulating film, a first contact region including a plurality of contacts and provided in the second insulating film and the third insulating film, for electrically connecting the resistive layer to the second wiring layer and a second contact region including a plurality of contacts and provided in the second insulating film, for electrically connecting the resistive layer to said first wiring layer. The contacts of the second contact region are arranged on and along a periphery of a polygonal shape having a center registered with a center point of the first contact region.

9 Claims, 3 Drawing Sheets

RESISTOR ELEMENT COMPRISING PERIPHERAL CONTACTS

BACKGROUND OF THE INVENTION

1. Field of the Invention

The present invention relates to a resistor element and, particularly, to a high precision resistor element to be used in an impedance matching.

2. Description of the Prior Art

With a recent speed up of a system control, various systems for high-speed interface have been proposed and standardized in semiconductor devices. In many of these interface systems, resistor elements are used for terminating transmission lines.

It has been usual that such resistor element is mounted on a substrate together with a semiconductor device. However, with the recent popularization of high speed interface, it has been requested to incorporate such resistor element in the semiconductor device since the resistor element tends to increase the mounting area. FIG. 5 is an illustrative plan view of a conventional resistor element incorporated in a semiconductor device. In FIG. 5, a first terminal 48 formed by a first wiring layer 47 is connected to one end of a resistor layer (WSi layer) 41 formed in a semiconductor device through a first contact 46 and a second terminal 49 formed by a second wiring layer 45 is connected to the other end thereof through a second contact 42.

However, it is required that a resistance value of a resistor element for impedance matching or termination is highly precise. FIG. 6 is a circuit diagram including a resistor element connected in series between a buffer and a wiring of a mounting substrate. Considering, for example, a case where a resistor element 51 formed in a semiconductor device such as shown in FIG. 6 is series-connected between an output buffer 52 in the semiconductor device and a wiring 53 on a mounting substrate, the purpose of the resistor element 51 is to correct an internal impedance of the output buffer 52 to thereby match it with a characteristics impedance of the wiring 53. It becomes possible to restrict noise caused by reflection due to increase of signal speed, by precisely performing this impedance matching. Therefore, the resistance value of the resistor element must be highly precise.

When such resistor element is incorporated within the semiconductor device, it is difficult in a conventional layout shown in FIG. 5 to guarantee the resistance value. That is, since the resistance value R of the resistor element having layout shown in FIG. 5 is determined by a formula $R=\rho s\times L/W$ where L is length of the WSi layer, W is width of the WSi layer and ρs is sheet resistance, a change of outer configuration (L and W) due to variation of process such as etching process influences the resistance value directly.

BRIEF SUMMARY OF THE INVENTION

Object of the Invention

An object of the present invention is to provide a highly precise resistor element, which is hardly influenced by variation of size thereof due to process.

Summary of the Invention

A resistor element according to the present invention comprises a resistive layer provided on a semiconductor substrate through a first insulating film, a first wiring layer provided on the resistive layer through a second insulating film, a second wiring layer provided on the first wiring layer through a third insulating film, a group of first contact regions provided in the second and third insulating films for electrically connecting the resistive layer to the second wiring layer and a group of second contact regions provided in the second insulating film for electrically connecting the resistive layer to the first wiring layer. The second contact regions are provided on and along a circular line or a polygonal line having a center registered with a center point of the first contact region group.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
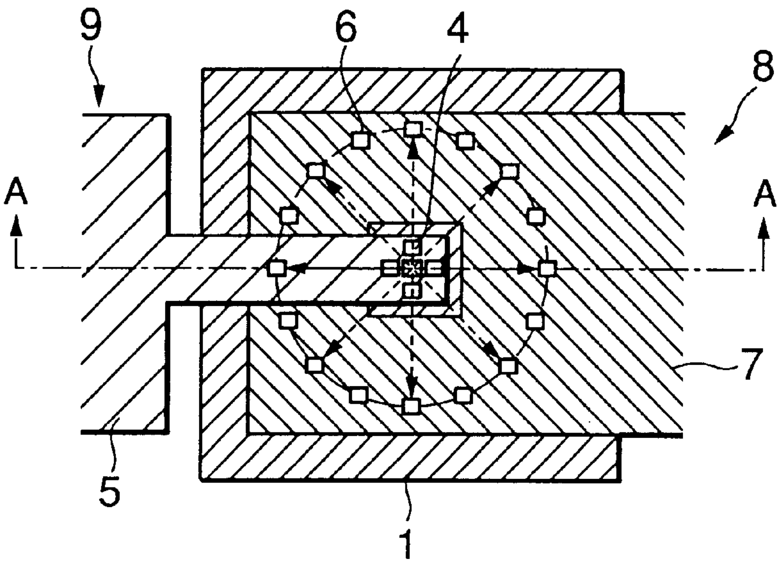
FIG. 1 is an illustrative plan view showing a layout of a resistor element formed in a semiconductor device according to a first embodiment of the present invention.

Now, the present invention will be described with reference to the drawings. FIG. 1 is an illustrative plan view showing a layout of a resistor element formed in a semiconductor device according to a first embodiment of the present invention and FIG. 2 is a cross section taken along a line A—A in FIG. 1.

The resistor element formed in the semiconductor device according to the first embodiment of the present invention is featured by that it has a highly precise resistance value, which is hardly influenced by size variation of an outer configuration of the resistor element due to fabrication process thereof. This is realized mainly by lead terminals of a resistive layer 1 of the resistor element, which is a WSi layer. That is, a center portion of the rectangular resistive layer 1 is electrically connected to wiring through electrically conductive material filling contact holes formed in an insulating film 10. Each such connection structure including a plurality of contact holes filled with electrically conductive material for electrically connecting wiring layers to the resistive layer 1 will be referred to as a "contact region", hereinafter. A plurality of first contacts constituting a first contact region 6 are provided on and along a periphery of a circular shape having a center registered with centers of a second contact region 2 and a first contact region 4, and a second wiring layer 5 and a first wiring layer 7, which are connected to these contact regions, form a first terminal 8 and a second terminal 9, respectively. Therefore, a current path between the terminals in the resistive layer 1 is restricted to an area within the circular shape defined by the first contact region group 6, so that an influence of change of an outer configuration of the resistive layer due to process on the resistance value of the resistive layer is minimized.

Figure 2:
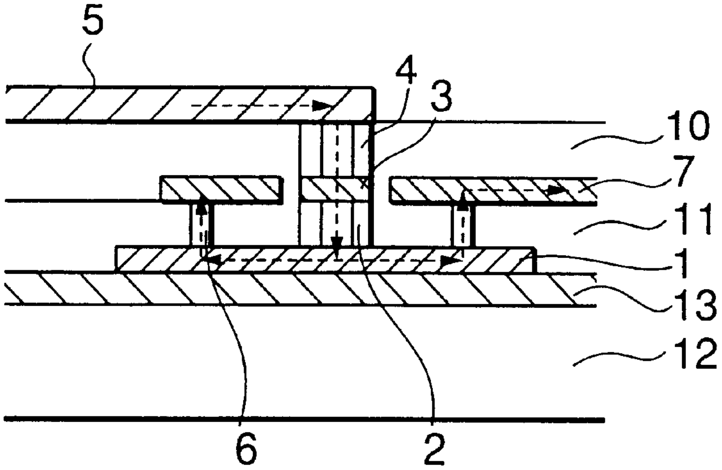
FIG. 2 is a cross section taken along a line A—A in FIG. 1.

As shown in FIGS. 1 and 2, the second contact region 2 is provided in the center portion of the WSi layer as the resistive layer 1 formed on the substrate through an insulating film 13 and connected to the second wiring layer 5 through a conductive layer 3 and a third contact region 4, to form the second terminal 9. On the other hand, the first contacts constituting a first contact region 6 are provided on and along a periphery of the circular shape having the center registered with the centers of the second contact region 2 of the second terminal 9 and connected to the first wiring layer 7 having a center portion opened, to form the first terminal 8.

Figure 6:
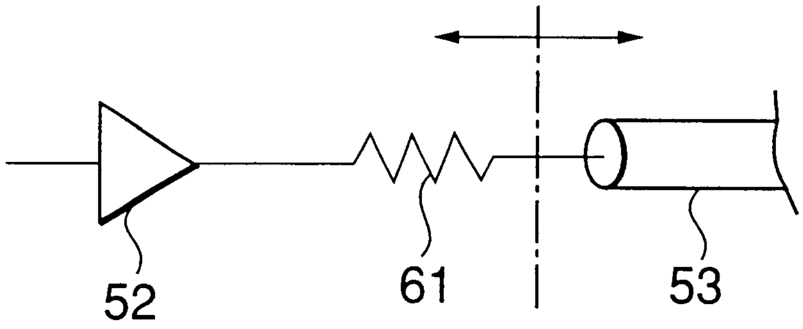
FIG. 6 is a circuit diagram of a resistor element connected in series between a buffer and a wiring of a mounting substrate.

With employment of such structure, the current path in the resistive layer 1 when a voltage is applied between the first terminal 8 and the second terminal 9 is restricted to the area within the circular shape defined by the first contact region 6 as shown by dotted arrows in FIGS. 1 and 2. Since, therefore, a portion of the resistive layer 1 outside the circular shape does not function as resistor element, the resistance value of the resistor element is determined by not the outer configuration of the resistive layer 1 but the arrangement of the contacts. As a result, deformation of the WSi layer, which is the resistive layer 1, due to variation of process does not influence the resistance value thereof. Therefore, by forming the resistor element 51 shown in FIG. 6 with using the above-mentioned layout, it is possible to obtain a stable resistance value to thereby expect a desired effect of impedance matching. Although, in this embodiment, the number of the contacts in each contact region is 16, the number of the contacts is not limited thereto. It is possible to obtain the effect of the present invention by using at least 4 contacts.

Since, in the first embodiment of the present invention, the resistance value of the resistive layer 1 is determined by the size of the circle constituted by the second contact region 6, the resistance value is not influenced even when the outer configuration of the WSi layer is changed due to variation of process such as etching process.

Figure 3:
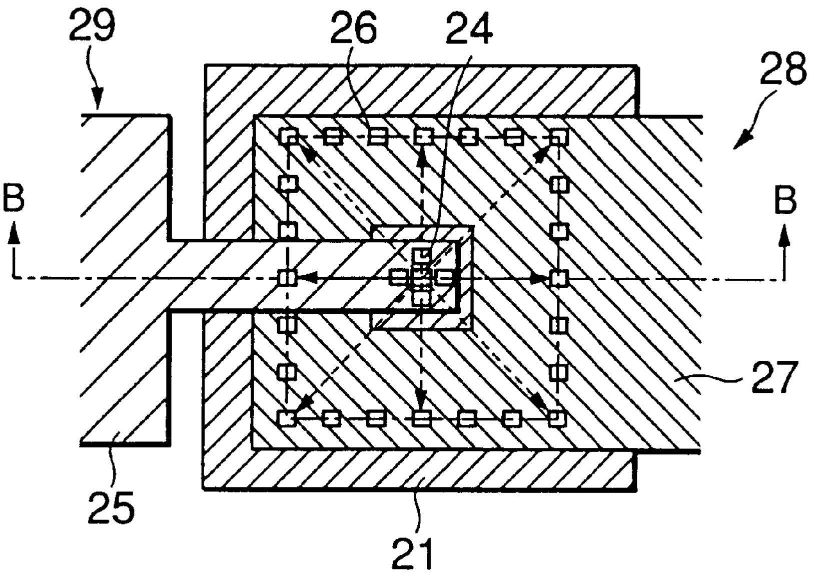
FIG. 3 is an illustrative plan view showing a layout of a resistor element formed in a semiconductor device according to a second embodiment of the present invention.
Figure 4:
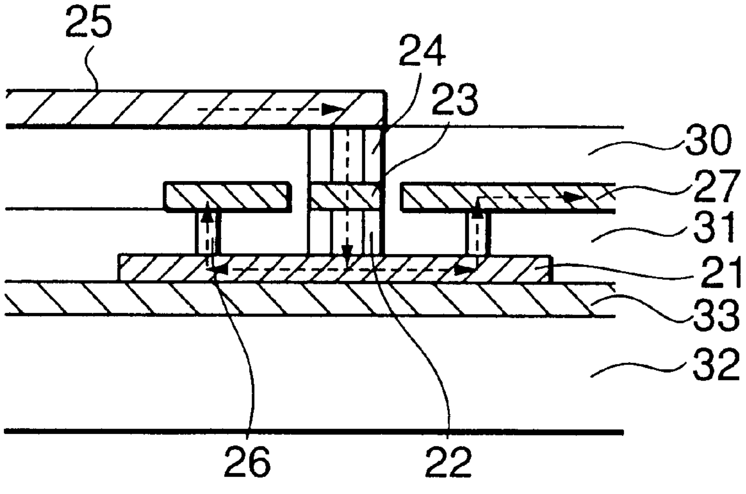
FIG. 4 is a cross section taken along a line B–B in FIG. 3.

A second embodiment of the present invention will be described with reference to FIGS. 3 and 4, in which FIG. 3 is an illustrative plan view showing a layout of a resistor element formed in a semiconductor device according to the second embodiment of the present invention and FIG. 4 is a cross section taken along a line B—B in FIG. 3.

The second embodiment differs from the first embodiment in the arrangement of contacts constituting a second contact region 26. Although, in the first embodiment, the contacts of the second contact region 6 are arranged on the periphery of a circular shape as shown in FIG. 1, the contacts of the second contact region 26 are arranged on and along a periphery of a square shape as shown in FIG. 3.

With such square arrangement of the contacts of the second contact region, it is possible to improve the area efficiency compared with the first embodiment. This means that it is possible to obtain a higher resistance value with smaller area of the resistive layer.

As shown in FIG. 4, the layout structure and functions of other portions of the semiconductor device of the second embodiment than the contact arrangement are the same as those of the first embodiment and, therefore, details thereof are omitted. However, in the second embodiment, substantially the same effect in restricting the process-caused variation of the outer configuration as that obtainable by the first embodiment can be expected.

In view of the easiness of calculation of the resistance value and the stability of the resistance value obtainable by the symmetry of the current path, the first embodiment is advantageous. Therefore, it becomes possible to realize a resistor element on demand, by properly using the first and second embodiments.

Although, in the second embodiment, 24 contacts are provided as the first contact region, the number of the contacts is not limited to 24. In order to obtain the effect of the present invention, it is enough to arrange the contacts each at each corner of the square shape. That is, the effect of the present invention can be obtained by at least 4 contacts.

Further, in the second embodiment, the shape having a periphery along which the contacts are arranged is not limited to a square. In the present invention, the effect can be obtained by arranging the contacts on and along a periphery of any equilateral polygonal shape including an equilateral triangle shape.

The electrically conductive layer 3 has been described as provided discretely. It may be possible to form the discrete conductive layer 3 by etching a center portion of the first wiring layer 7 formed on the first interlayer insulating film 11 to form an annular opening in the center portion to thereby leave a portion of the first wiring layer in the annular opening as a discrete conductive layer.

In view of the fabrication process, the resistive layer 1 and the second wiring layer 5 are connected each other through the second contact region 2, the conductive layer 3 and the third contact region 4. However, the resistive layer 1 and the second wiring layer 5 are connected each other directly by using only the contact regions or using a single contact having large diameter.

Although adjacent contacts of the first contact region are preferably separated equidistantly, the distances between adjacent ones of the contact of the first contact region may be different.

Although, in the described embodiments, the WSi layer is used as the resistive layer 1, the latter may be formed of other resistive material such as high resistance polysilicon.

Figure 5:
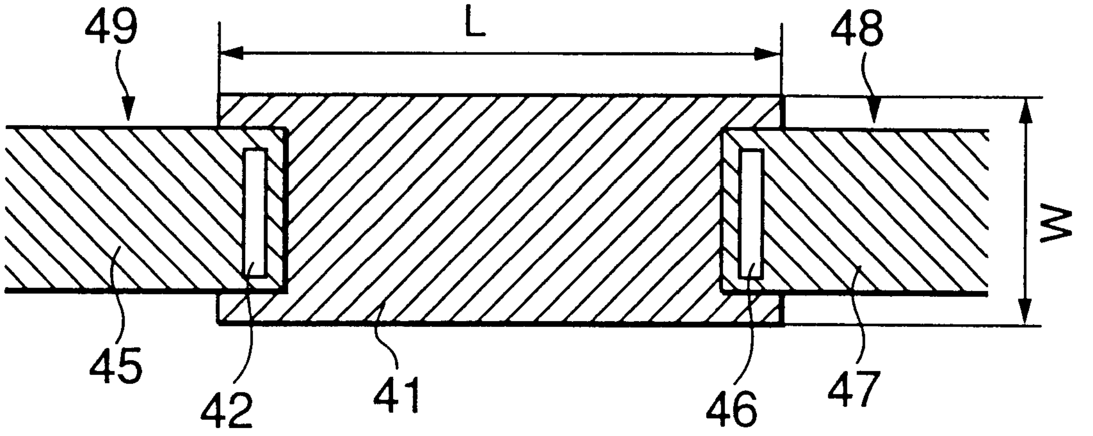
FIG. 5 is an illustrative plan view showing a layout of a resistor element incorporated in a conventional semiconductor device.

It is usual that the process variation related to the width of wiring and the diameter of contact hole, etc., is managed such that it becomes within ±10% of the minimum value (design rule) allowed in each fabrication step. That is, when the length L and the width W of the WSi layer in the conventional resistor element in the layout shown in FIG. 5 are set to values close to the design rule, the process variation thereof becomes about ±10%, which is the variation of the resistance value. As mentioned previously, however, the influence of such variation is removed when the layout of the present invention is used.

When the present invention is applied to a fabrication method of a resistor element of a semiconductor device, there is no severe preciseness control required in the resistive layer forming step and inexpensive reticule and process can be used, resulting in a reduction of cost.

Although the present invention has been described with reference to specific embodiments, this description is not meant to be construed in a limiting sense. Various modifications of the disclosed embodiments will become apparent to persons skilled in the art upon reference to the description of the invention. It is, therefore, contemplated as fall within the true scope of the present invention.

What is claimed is:

1. A resistor element comprising:

a resistive layer provided on a semiconductor substrate through a first insulating film;

a first wiring layer provided on said resistive layer through a second insulating film;

a second wiring layer provided on said first wiring layer through a third insulating film;

a first contact region including a plurality of contacts and provided in said second insulating film and said third insulating film, for electrically connecting said resistive layer to said second wiring layer; and a second contact region including a plurality of contacts and provided in said second insulating film, for electrically connecting said resistive layer to said first wiring layer, wherein said contacts of said second contact region are arranged on and along a periphery of a circular shape having a center registered with a center point of said first contact region.

2. A resistor element as claimed in claim 1, wherein said contacts of each said contact region are arranged equidistantly.

3. A resistor element as claimed in claim 1, wherein said resistive layer is a WSi layer.

4. A resistor element as claimed in claim 1, wherein said resistive layer is a high resistance polysilicon layer.

5. A resistor element comprising:

a resistive layer provided on a semiconductor substrate through a first insulating film;

a first wiring layer provided on said resistive layer through a second insulating film;

a second wiring layer provided on said first wiring layer through a third insulating film;

a first contact region including a plurality of contacts and provided in said second insulating film and said third insulating film, for electrically connecting said resistive layer to said second wiring layer; and a second contact region including a plurality of contacts and provided in said second insulating film, for electrically connecting said resistive layer to said first wiring layer, wherein said contacts of said second contact region are arranged on and along a periphery of a polygonal shape having a center registered with a center point of said first contact region.

6. A resistor element as claimed in claim 5, wherein said contacts of each said contact region are arranged equidistantly.

7. A resistor element as claimed in claim 5, wherein said resistive layer is a WSi layer.

8. A resistor element as claimed in claim 5, wherein said resistive layer is a high resistance polysilicon layer.

9. A resistor element as claimed in claim 5, wherein said polygonal shape is a square shape.

* * * * *